United States Patent
Dodge

(10) Patent No.: US 7,029,978 B2
(45) Date of Patent: Apr. 18, 2006

(54) CONTROLLING THE LOCATION OF CONDUCTION BREAKDOWN IN PHASE CHANGE MEMORIES

(75) Inventor: Rick K. Dodge, Santa Clara, CA (US)

(73) Assignee: Intel Corporation, Santa Clara, CA (US)

(*) Notice: Subject to any disclaimer, the term of this patent is extended or adjusted under 35 U.S.C. 154(b) by 119 days.

(21) Appl. No.: 10/633,869

(22) Filed: Aug. 4, 2003

(65) Prior Publication Data

US 2005/0032319 A1    Feb. 10, 2005

(51) Int. Cl.
  *H01L 21/336*   (2006.01)
(52) U.S. Cl. ............................ 438/293; 438/308
(58) Field of Classification Search ............ 438/293, 438/294, 295, 302, 304, 308
   See application file for complete search history.

(56) References Cited

U.S. PATENT DOCUMENTS 4,931,897 A * 6/1990 Tsukamoto et al. ......... 361/313
6,300,684 B1 * 10/2001 Gonzalez et al. ........... 257/774
6,614,644 B1 * 9/2003 Chazono et al. ........ 361/321.2
2004/0113135 A1 * 6/2004 Wicker ......................... 257/2

OTHER PUBLICATIONS

Hwang, Y.N., Hong, J.S., Lee, S.H., Ahn, S.J., Jeong, G.T., Koh, G.H., Kim, H.J., Jeong, W.C., Lee, S.Y., Park, J.H., Ryoo, K.C.., Horii, H., Ha, Y.H., Yi, J.H., Cho, W.Y., Kim, Y.T., Lee, K.H., Joo, S.H., Park, S.O., Jeong, U.I., Jeong, H.S. and Kim, Kinam, "Completely CMOS-Compatible Phase-Change Nonvolatile RAM Using NMOS Cell Transistors," presented at 2003 19th IEEE Non-Volatile Semiconductor Memory Workshop, Monterey, California, Feb. 26-20, 2003.

(Continued)

Primary Examiner—Phuc T. Dang
(74) Attorney, Agent, or Firm—Trop, Pruner & Hu, P.C.

(57) ABSTRACT

A phase change memory may be formed in a pore of a semiconductor structure. A selected region of the pore may be processed so that breakdown in that region is either more or less likely. As a result, by reducing the variation in the location of breakdown from cell to cell and memory to memory, greater consistency can be achieved.

30 Claims, 3 Drawing Sheets

OTHER PUBLICATIONS

Ha, Y.H., Yi, J.H., Horii, H., Park, J.H., Joo, S.H., Park, S.O., Chung, U-In and Moon, J.T., "An Edge Contact Type Cell for Phase Change RAM Featuring Very Low Power Consumption," presented at IEEE 2003 Symposium on VLSI Technology, Kyoto, Japan, Jun. 12-14, 2003.

Hwang, Y.N., Hong, J.S., Lee, S.H., Ahn, S.J., Jeong, G.T., Koh, G.H., Oh, J.H., Kim, H.J., Jeong, W.C., Lee, S.Y., Park, J.H., Ryoo, K.C., Horii, H., Ha, Y.H., Yi, J.H., Cho, W.Y., Kim, Y.T., Lee, K.H., Joo, S.H., Park, S.O., Chung, U.I., Jeong, H.S. and Kim, Kinam, "Full Integration and Reliability Evaluation of Phase-change RAM Based on 0.24 mm-CMOS Technologies," presented at IEEE 2003 Symposium on VLSI Technology, Kyoto, Japan, Jun. 12-14, 2003.

Horii, H., Yi, J.H., Park, J.H., Ha, Y.H., Baek, I.G., Park, S.O., Hwang, Y.N., Lee, S.H., Kim, Y.T., Lee, K.H., Chung, U-In and Moon, J.T., "A Novel Cell Technology Using N-doped GeSbTe Films for Phase Change RAM," presented at IEEE 2003 Symposium on VLSI Technology, Kyoto, Japan, Jun. 12-14, 2003.

* cited by examiner

CONTROLLING THE LOCATION OF CONDUCTION BREAKDOWN IN PHASE CHANGE MEMORIES

BACKGROUND

This invention relates generally to phase change memories.

Phase change memory devices use phase change materials, i.e., materials that may be electrically switched between a generally amorphous and a generally crystalline state, as an electronic memory. One type of memory element utilizes a phase change material that may be, in one application, electrically switched between generally amorphous and generally crystalline local orders or between different detectable states of local order across the entire spectrum between completely amorphous and completely crystalline states.

Typical materials suitable for such an application include various chalcogenide elements. The state of the phase change materials is also non-volatile. When the memory is set in either a crystalline, semi-crystalline, amorphous, or semi-amorphous state representing a resistance value, that value is retained until reprogrammed, even if power is removed. This is because the programmed value represents a phase or physical state of the material (e.g., crystalline or amorphous).

When a potential is applied across the phase change memory, conduction may occur. In many cases in phase change memories, the exact location where the conductive breakdown occurs through the phase change memory is subject to considerable variability. As a result, since bits may breakdown at different locations, any given bit may exhibit programming or reading characteristics that are different from other bits in the memory. This means that the programming and/or reading margin must be higher in order to accommodate various characteristics of a whole range of different bits.

Thus, there is a need for better ways to form phase change memories.

DETAILED DESCRIPTION

Figure 1:
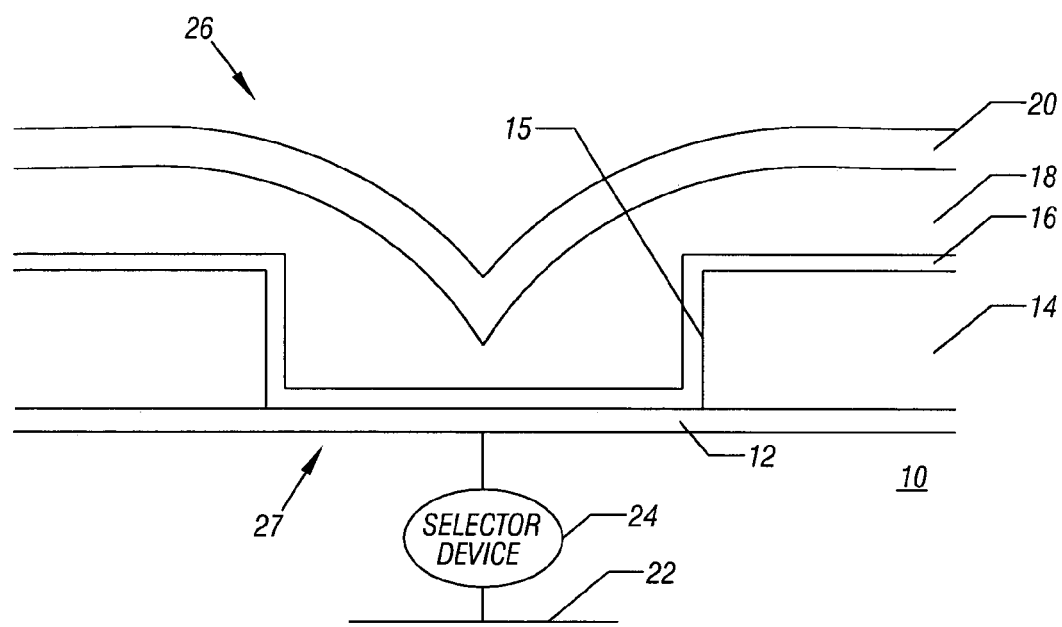
FIG. 1 is an enlarged cross-sectional view of one embodiment of the present invention.

Referring to FIG. 1, a memory 26 may include a plurality of cells 27 formed on a semiconductor substrate 10. In one embodiment, the substrate 10 may include a conductive line 22 that may be a row line in one embodiment. The row line 22 may be coupled to cells 27 through a selection device 24 in one embodiment. The selection device 24 may be a diode or transistor, as two examples. Another conductive line 20 that may be called a column that may run transversely to the line 22 in one embodiment. Thus, a plurality of cells 27 may be addressably accessed in an array of conductive lines 20 and 22.

The phase change memory 26 may include an insulator 14 having a pore or aperture 15 formed therethrough. The insulator 14 may be any dielectric, including oxide. The pore 15 may expose a lower electrode 12 coupled electrically to the selection device 24. Above the electrode 12 may be a thin dielectric layer 16, such as a nitride layer that functions as a conduction breakdown layer. In some cases, the layer 16 may be on the order of 30 Angstoms. A phase change memory material 18 may be applied over the dielectric layer 16. The upper conductive line 20 may be deposited over the phase change material 18 in one embodiment of the present invention.

In one embodiment, the memory material 18 may be a non-volatile, phase change material. In this embodiment, the memory 26 may be referred to as a phase change memory. A phase change material may be a material having electrical properties (e.g. resistance) that may be changed through the application of energy such as, for example, heat, light, voltage potential, or electrical current. Examples of a phase change material may include a chalcogenide material or an ovonic material.

An ovonic material may be a material that undergoes electronic or structural changes and acts as a semiconductor when subjected to application of a voltage potential, an electrical current, light, heat, etc. A chalcogenide material may be a material that includes at least one element from column VI of the periodic table or may be a material that includes one or more of the chalcogen elements, e.g., any of the elements of tellurium, sulfur, or selenium. Ovonic and chalcogenide materials may be non-volatile memory materials that may be used to store information.

In one embodiment, the memory material 18 may be a chalcogenide element composition of the class of tellurium-germanium-antimony ($Te_xGe_ySb_z$) material or a GeSbTe alloy, although the scope of the present invention is not limited to just these.

In one embodiment, if the memory material 18 is a non-volatile, phase change material, then memory material 18 may be programmed into one of at least two memory states by applying an electrical signal to memory material 18. The electrical signal may alter the phase of memory material 18 between a substantially crystalline state and a substantially amorphous state, wherein the electrical resistance of memory material 18 in the substantially amorphous state is greater than the resistance of memory material 18 in the substantially crystalline state. Accordingly, in this embodiment, memory material 16 may be adapted to be altered to one of at least two resistance values within a range of resistance values to provide single bit or multi-bit storage of information.

Programming of the memory material 18 to alter the state or phase of the material may be accomplished by applying voltage potentials to lines 20 and 22, thereby generating a voltage potential across memory material 18. An electrical current may flow through a portion of memory material 18 in response to the applied voltage potentials, and may result in heating of memory material 18.

This heating and subsequent cooling may alter the memory state or phase of memory material 18. Altering the phase or state of memory material 18 may alter an electrical characteristic of memory material 18. For example, the resistance of the material may be altered by altering the phase of the memory material 18. Memory material 18 may also be referred to as a programmable resistive material or simply a programmable material.

In one embodiment, a voltage potential difference of about three volts may be applied across a portion of memory material 18 by applying about three volts to line 20 and about zero volts to the electrode 12. A current flowing through memory material 18 in response to the applied voltage potentials may result in heating of memory material 18. This heating and subsequent cooling may alter the memory state or phase of memory material 18.

In a "reset" state, the memory material 18 may be in an amorphous or semi-amorphous state and in a "set" state, the memory material 18 may be in a crystalline or semi-crystalline state. The resistance of memory material 18 in the amorphous or semi-amorphous state may be greater than the resistance of memory material 18 in the crystalline or semi-crystalline state. The association of reset and set with amorphous and crystalline states, respectively, is a convention. Other conventions may be adopted.

Due to electrical current, the memory material 18 may be heated to a relatively higher temperature to amorphisize memory material 18 and "reset" memory material 18 (e.g., program memory material 18 to a logic "0" value). Heating the volume of memory material 18 to a relatively lower crystallization temperature may crystallize memory material 18 and "set" memory material 18 (e.g., program memory material 18 to a logic "1" value). Various resistances of memory material 18 may be achieved to store information by varying the amount of current flow and duration through the volume of memory material 18.

The information stored in memory material 18 may be read by measuring the resistance of memory material 18. As an example, a read current may be provided to memory material 18 using lines 20 and 22, and a resulting read voltage across memory material 18 may be compared against a reference voltage using, for example, a sense amplifier (not shown). The read voltage may be proportional to the resistance exhibited by the memory cell. Thus, a higher voltage may indicate that memory material 18 is in a relatively higher resistance state, e.g., a "reset" state; and a lower voltage may indicate that the memory material 18 is in a relatively lower resistance state, e.g., a "set" state.

With the embodiment shown in FIG. 1, in order to cause conduction between the lines 22 and 20, through the memory material 18, a breakdown of the film 16 occurs. After the breakdown, the phase change material 18 may be permanently shorted at the breakdown location to the electrode 12. When an adequate breakdown voltage is applied across it, the film 16 breaks down, creating a small conductive channel through the film 16 at the location of breakdown. The thin film 16 necessarily varies in thickness and consistency as deposited. Therefore, the breakdown is usually at the thinnest point of the film 16 or wherever the electric field strength is at its highest. Unfortunately, this point may occur at random positions in the pore 15 along the length of the films 16 used to form different cells 27.

Figure 2:
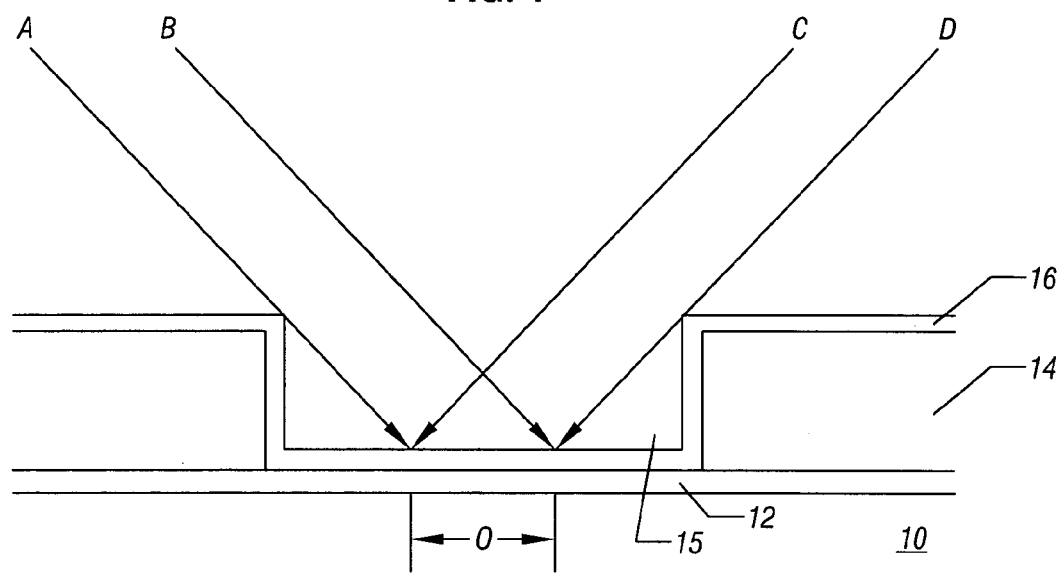
FIG. 2 is an enlarged cross-sectional view at an early stage of manufacture in accordance with one embodiment of the present invention.

Referring to FIG. 2, the film 16 may be exposed to impact energy, such as an ion implant, in order to either strengthen or weaken the film 16 at one of two areas. The film 16 may be deposited in a pore 15 over the electrode 12 and insulator 14. In the embodiment shown in FIG. 2, the film 16 may be ion implanted in the central region "0" of the pore 15. This region then may, in one embodiment, be weaker so that breakdown is more likely to occur in the central region "0." Alternatively, some types of ion implants may actually increase the strength and breakdown voltage of an affected film region, thereby making it more likely that the film 16 will breakdown down outside the implanted region "0" in FIG. 2.

In accordance with one embodiment of the present invention, an angled ion beam, indicated by the letters A to B, and C to D may be applied to a wafer including the substrate 10. As the wafer is rotated, the central region, indicated as 0, receives more of the implant dose. In some embodiments, the rotation may occur through more than 10 wafer rotations so that the starting point of the application of the ion implantation is not significant. Alternatively, the implant can be applied at two or more complementary angles. This may result in a greater differential of dopant dose at the center of the active area of the pore 15.

If the beam is positioned with one angle and aspect ratio as shown in FIG. 2, the center portion of the pore 15 sees more implant dose or implantation species.

Figure 3:
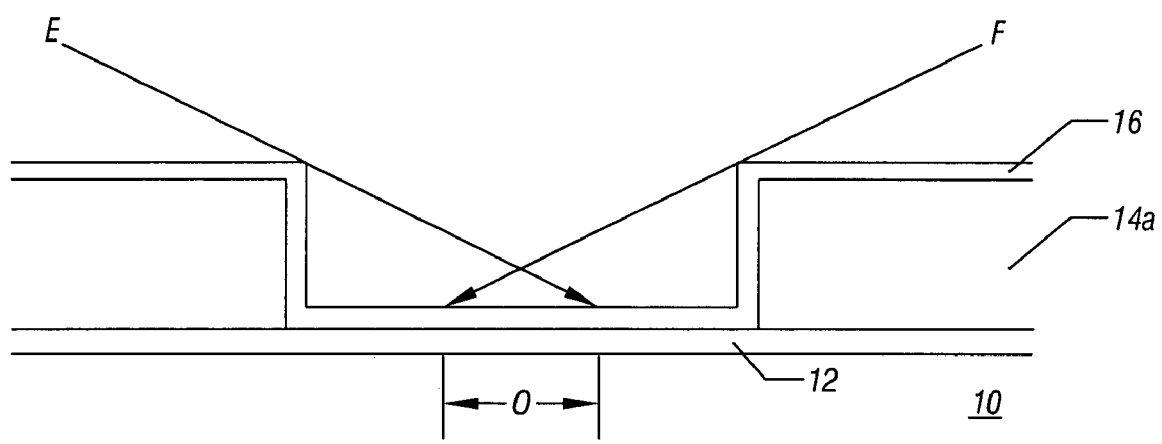
FIG. 3 is an enlarged cross-sectional view at an early stage of manufacture in accordance with another embodiment of the present invention.

With a different configuration, such as a different aspect ratio or different implant angle, as shown in FIG. 3, the pore 15 perimeter region outside the central region O in FIG. 3, sees the higher dose.

Thus, positioning for center breakdown or perimeter breakdown may be accomplished depending on the implant type and cumulative doping, and whether the beam, doping and acceleration are selected to weaken or strengthen the film 16.

In accordance with some embodiments of the present invention, by making the breakdown location less random, more consistency can be created from cell to cell and memory to memory. This consistency may provide more uniform device characteristics such as reset current and set resistance. This consistency may also result in a more efficient device with lower reset current in some embodiments. Statistical consistency of reset current and set resistance may be determined by the size and location of the breakdown location. A tighter distribution may result in easier devices to program and read with enhanced endurance, in some embodiments.

Figure 4:
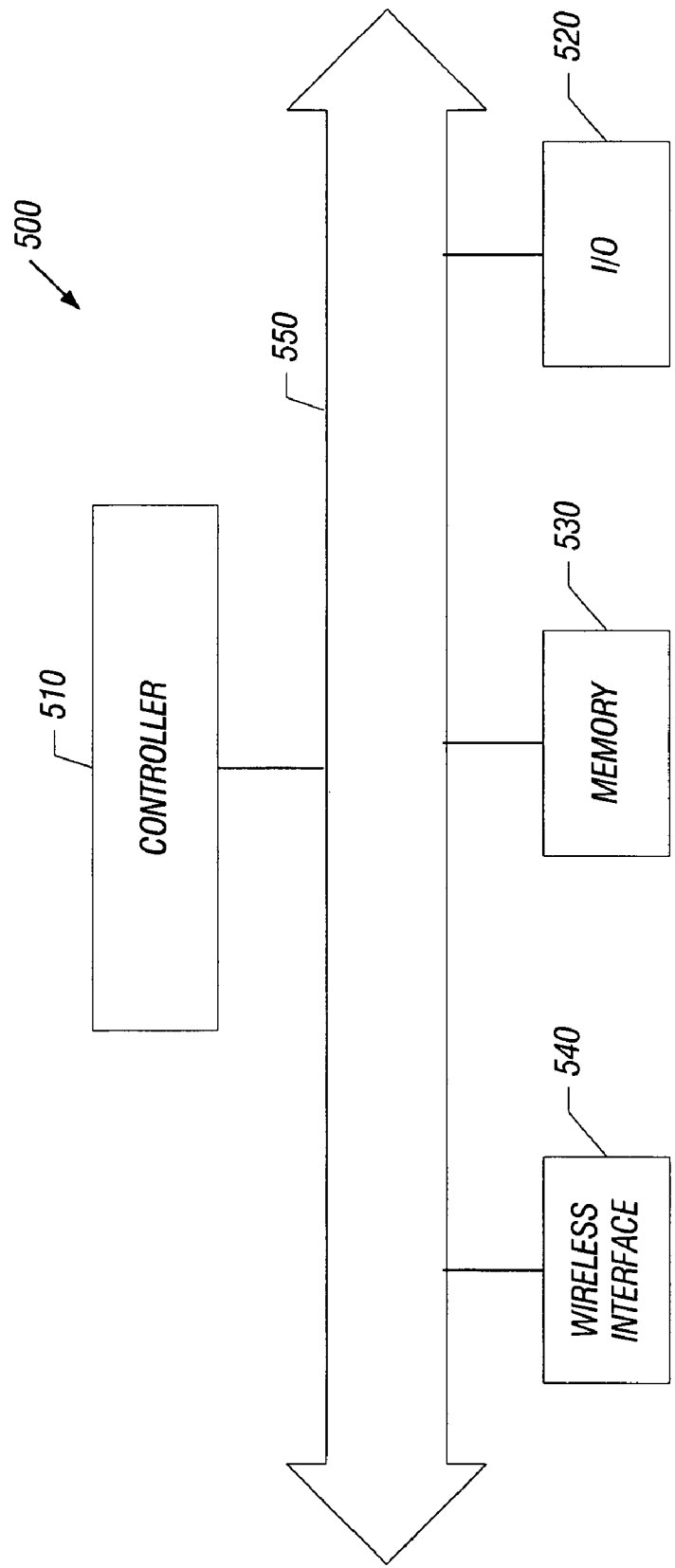
FIG. 4 is a schematic depiction of the system in accordance with one embodiment of the present invention.

Turning to FIG. 4, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, and a wireless interface 540 coupled to each other via a bus 550. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise a volatile memory (any type of random access memory), a non-volatile memory such as a flash memory, and/or phase change memory that includes a memory element such as, for example, memory 26 illustrated in FIG. 1.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a phase change memory pore including a breakdown layer in said pore and increasing the likelihood that a breakdown will occur in one region of said breakdown layer in said pore rather than another region of said breakdown layer in said pore.

2. The method of claim 1 including forming a phase change memory pore by:
   forming an electrode over a substrate;
   forming a dielectric layer with an aperture; and
   forming a breakdown layer over said electrode in said aperture.

3. The method of claim 2 including forming a phase change material over said layer and coupling said phase change material between an upper conductive line and a lower conductive line.

4. The method of claim 3 including coupling the lower conductive line to said electrode through a selector device.

5. The method of claim 1 including ion implanting a portion of said layer to change the likelihood of breakdown in that implanted portion relative to an unimplanted portion of said layer.

6. The method of claim 5 including implanting at an angle.

7. The method of claim 6 including forming a pore defined in an insulator and implanting at an angle such that said insulator acts as a mask to said ion implantation.

8. The method of claim 1 including forming a relatively centrally located region within said pore that is more likely to breakdown.

9. The method of claim 1 including forming a relatively peripherally located region in said pore that is more likely to breakdown.

10. The method of claim 1 including damaging one region of said layer to change the likelihood that a breakdown will occur in that region relative to another region.

11. A memory comprising:
    a breakdown layer between a pair of electrodes, said breakdown layer being ion implanted to increase the likelihood that a breakdown will occur in one region rather than another region of said layer.

12. The memory of claim 11 wherein said memory is a phase change memory including a phase change material between said electrodes.

13. The memory of claim 12 wherein said phase change material is a chalcogenide.

14. The memory of claim 13 including a substrate and a dielectric layer over said substrate with an aperture formed therein, an electrode being positioned at the bottom of said aperture and said breakdown layer being positioned over said electrode in said aperture.

15. The memory of claim 14 wherein said phase change material is over said breakdown layer.

16. The memory of claim 15 including an upper conductive line over said phase change material and a lower conductive line under said electrode.

17. The memory of claim 11 wherein said breakdown layer is formed of an insulator.

18. The memory of claim 17 wherein said insulator includes nitride.

19. The memory of claim 11 wherein a central portion of said layer is ion implanted and a peripheral region of said breakdown layer is not ion implanted.

20. A system comprising:
    a processor-based device;
    a wireless interface coupled to said processor-based device; and
    a semiconductor memory coupled to said device, said memory including a pair of electrodes, a breakdown layer between said pair of electrodes, said breakdown layer being ion implanted to increase the likelihood that a breakdown will occur in one region rather than another region of said layer.

21. The system of claim 20 wherein said memory is a phase change memory including a phase change material between said electrodes.

22. The system of claim 21 wherein said phase change material is a chalcogenide.

23. A method comprising:
    forming a breakdown layer between a pair of electrodes and increasing the likelihood that a breakdown will occur in one region rather than another region of said layer by damaging said one region and not damaging said other region.

24. The method of claim 23 including forming a phase change material between said electrodes.

25. The method of claim 23 including ion implanting said breakdown layer.

26. A memory comprising:
    a breakdown layer between a pair of electrodes, said breakdown layer having a central region and a peripheral region between said electrodes, one of said central and said peripheral regions being damaged such that a breakdown is more likely to occur in one of said regions than the other of said regions.

27. The memory of claim 26 including a phase change material between said electrodes.

28. The memory of claim 27 wherein said breakdown layer is ion implanted.

29. The method of claim 28 including a dielectric over a substrate, said dielectric having an aperture and said breakdown layer being formed in said aperture.

30. The memory of claim 29 including an electrode at the bottom of said aperture and another electrode over said aperture, said phase change material being between said electrodes.

* * * * *